(12) United States Patent
Drögsler

(10) Patent No.: US 7,946,405 B2
(45) Date of Patent: May 24, 2011

(54) GUIDE PATH FOR ELECTRONIC COMPONENTS

(75) Inventor: Tassilo Drögsler, Rimsting (DE)

(73) Assignee: Multitest elektronische Systeme GmbH, Rosenheim (DE)

( * ) Notice: Subject to any disclaimer, the term of this patent is extended or adjusted under 35 U.S.C. 154(b) by 373 days.

(21) Appl. No.: 12/294,302

(22) PCT Filed: Dec. 6, 2007

(86) PCT No.: PCT/EP2007/010635
§ 371 (c)(1),
(2), (4) Date: Sep. 24, 2008

(87) PCT Pub. No.: WO2008/068026
PCT Pub. Date: Jun. 12, 2008

(65) Prior Publication Data
US 2009/0133984 A1  May 28, 2009

(30) Foreign Application Priority Data

Dec. 7, 2006 (DE) .......................... 10 2006 057 774

(51) Int. Cl.
*B65G 11/06* (2006.01)
(52) U.S. Cl. ............................ 193/15; 193/12; 198/532
(58) Field of Classification Search .................. 193/12, 193/15, 28, DIG. 1; 198/453, 532
See application file for complete search history.

(56) References Cited

U.S. PATENT DOCUMENTS

| 2,878,915 | A | | 3/1959 | Judge | |
|---|---|---|---|---|---|
| 3,002,600 | A | * | 10/1961 | Campbell | 193/25 FT |
| 3,054,170 | A | * | 9/1962 | Benichasa et al. | 29/810 |
| 3,107,767 | A | * | 10/1963 | Medoff et al. | 193/25 FT |
| 3,276,625 | A | * | 10/1966 | Ziskal | 221/167 |
| 3,448,507 | A | * | 6/1969 | Nalbantian et al. | 29/809 |
| 3,618,192 | A | * | 11/1971 | Hoffken | 221/220 |
| 3,956,812 | A | * | 5/1976 | Kawakami et al. | 29/768 |
| 4,501,380 | A | * | 2/1985 | Welch | 221/298 |
| 4,629,054 | A | * | 12/1986 | Kondo | 198/388 |
| 5,775,478 | A | * | 7/1998 | Shinjo | 198/389 |
| 6,364,088 | B1 | * | 4/2002 | Steffens et al. | 198/347.1 |
| 7,007,821 | B2 | * | 3/2006 | Aylward | 221/289 |
| 7,124,912 | B2 | * | 10/2006 | Aylward | 221/236 |
| 2002/0027059 | A1 | | 3/2002 | Saito et al. | |

FOREIGN PATENT DOCUMENTS

| DE | 197 33 937 | 8/1997 |
|---|---|---|
| GB | 92 16 115.4 | 3/1993 |
| JP | 02-127312 | 5/1990 |
| JP | 04-199797 | 7/1992 |
| JP | 10-290096 | 10/1998 |

OTHER PUBLICATIONS

International Search Report for PCT/EP2007/010635, mailed May 19, 2008.

* cited by examiner

*Primary Examiner* — Douglas A Hess
(74) *Attorney, Agent, or Firm* — Nixon & Vanderhye PC

(57) ABSTRACT

A guide rail for electronic components, especially for use in robots for electronic components. The guide rail comprises a vertical or inclined guide duct that is provided with a curved, undulating guide track along at least one section thereof in order to decelerate components as the components slide within the guide track.

8 Claims, 3 Drawing Sheets

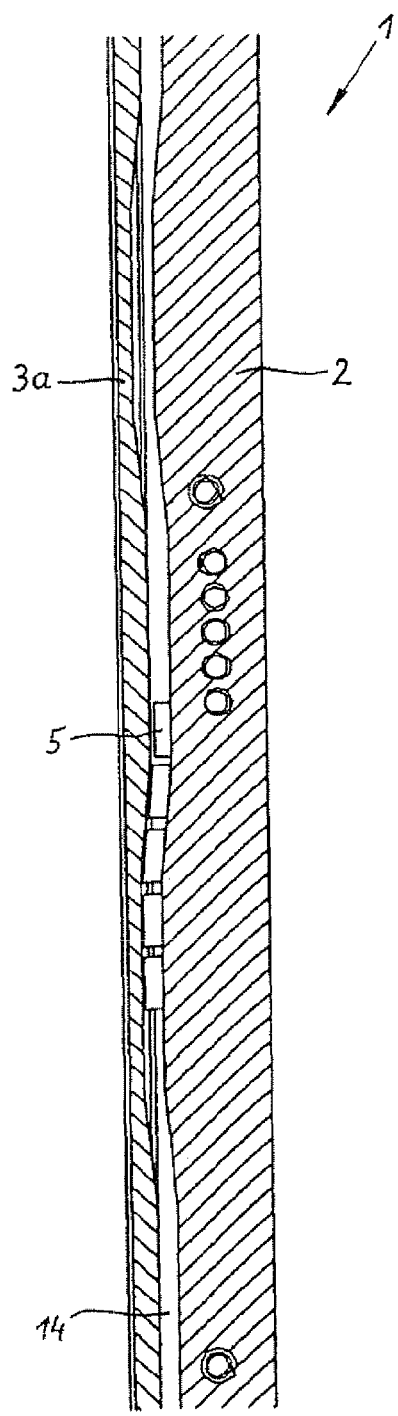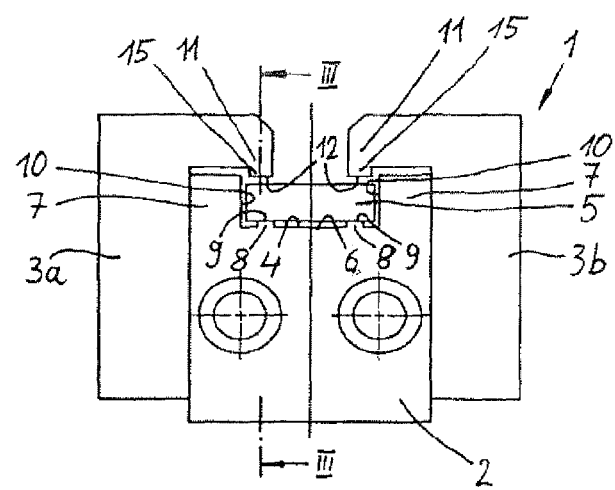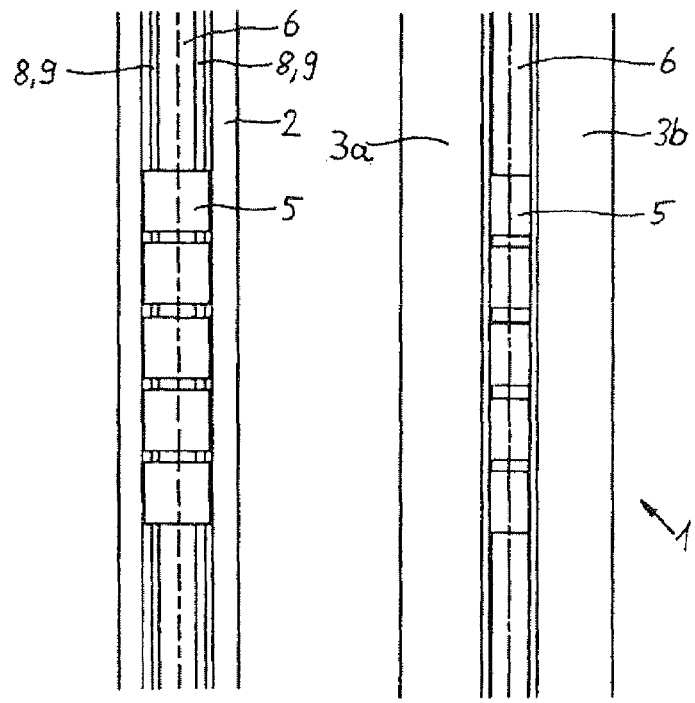
Fig. 3
Fig. 4
Fig. 5
Fig. 6

US 7,946,405 B2

GUIDE PATH FOR ELECTRONIC COMPONENTS

This application is the U.S. national phase of International Application No. PCT/EP2007/010635, filed 6 Dec. 2007, which designated the U.S. and claims priority to German Application No. 10 2006 057 774.4, filed 7 Dec. 2006, the entire contents of each of which are hereby incorporated by reference.

The invention relates to a guide path for electronic components, in particular for use in handling robots electronic components.

In the case of handling robots for the automatic checking of electronic components, known as test handlers, the electronic components which are to be checked or have already been tested are moved on guide paths through the handling robot up to a sorting magazine or an output means. Frequently used for this purpose are vertically or obliquely arranged guide paths in or on which gravity causes the components to slide onward.

Guide paths of this type are known for example from DE 197 33 937 C1. Guide paths of this type conventionally have rectilinear guide channels. However, a consequence of this is that when the components fall freely or almost freely downward within the guide channels, the components can become damaged, in particular if large differences in height are bridged. Such damage generally takes the form of external mechanical damage such as, for example, damage to the component body or damage to the circuits, legs, etc. Damage to internal structures caused by very long delays is also possible. Extreme delays occur in particular when the components strike stopping means (stoppers, singulators, etc.).

US 2002/0027059 A1 and DE 92 16 115 U1 disclose guide paths for electronic components having a vertical or oblique first portion and a horizontal second portion connected to the first portion by means of a simple arc.

The invention is based on the object of providing a guide path of the type mentioned at the outset that, reduces as simply as possible the risk of damage to electronic components which fall or slide in guide channels and strike stopping means or are otherwise subject to extreme delays.

In the case of the guide path according to the invention, the guide channel has an undulating and/or rotated guide track at least over a portion of its length.

On account of the undulating and/or rotated course of the guide track, the components are repeatedly diverted within the guide channel, as a result of which the friction between the guide track and components is increased accordingly. This reduces in a simple manner the fall or slip speed of the components within the guide channel, so that the components strike stopping means or other delay means at a much lower speed than if the components fall or slide along in a rectilinear guide channel. This allows damage to the components to be reduced in a simple and effective manner. A further advantage is the fact that the guide paths having such a course of the guide track take up no more or only slightly more space than those having a rectilinear course, so that allowance is also made for the requirements for a compact design. In many cases, deflections of just one or more millimeters are sufficient to achieve the desired effect. Furthermore, of particular advantage is the fact that the guide path according to the invention is equally suitable for the braking of components which slide along in the guide channel either individually or en masse. The guide paths according to the invention can be used for receiving, forwarding, tempering, singulating, testing, sorting out, outputting and storing electronic components, in particular ICs.

According to an advantageous embodiment, the guide track undulates in a plane lying perpendicularly to the base-side or cover-side guide surfaces.

According to an advantageous embodiment, the undulating course of the guide track is formed by base-side and cover-side guide rails on which the base-side and cover-side guide surfaces are provided, these guide surfaces being at varying distances from the base of the guide channel along the guide channel. This allows the guide channel to be formed rectilinearly per se and the components to be moved back and forth in an undulating manner within the guide channel. The base-side guide rails can in this case be formed in one piece with the remaining base part of the guide path that delimits the guide channel on the base side. Alternatively thereto, it is however readily possible to form the base-side guide rails as separate components which are connected to the base part.

Alternatively thereto, it is also readily possible to form the guide channel in an undulating manner, in which case the base-side guide rails are expediently at a uniform distance from the base of the guide channel.

Furthermore, depending on the type of components, it is also conceivable to provide guide rails which do not protrude beyond the base of the guide channel but rather form the base in a planar manner over the entire width thereof.

According to an alternative embodiment, the guide track undulates in a plane lying parallel to the base-side or cover-side guide surfaces. In this case, the waves of the guide track extend, viewed from above looking onto the guide path, laterally toward the left and right.

According to an advantageous embodiment, the undulating course of the guide track is formed by arched track portions. This results in a very uniform delay of the components.

According to an alternative embodiment, the undulating course of the guide track is formed by rectilinear, parallel track portions which are offset in the lateral or depth direction and are joined together by obliquely arranged or arched track portions.

The invention will be described hereinafter in greater detail and by way of example with reference to the drawings, in which:

FIG. 3 is a longitudinal section, through the guide path along the line III-III with components sliding along in the guide channel;

FIG. 4 is an end-face view of the guide path with a schematically indicated component;

FIG. 5 is a plan view onto a partial portion of the guide path from FIG. 3 without side parts;

FIG. 6 is a plan view onto a partial portion of the guide path from FIG. 3 with side parts.

Figure 1:
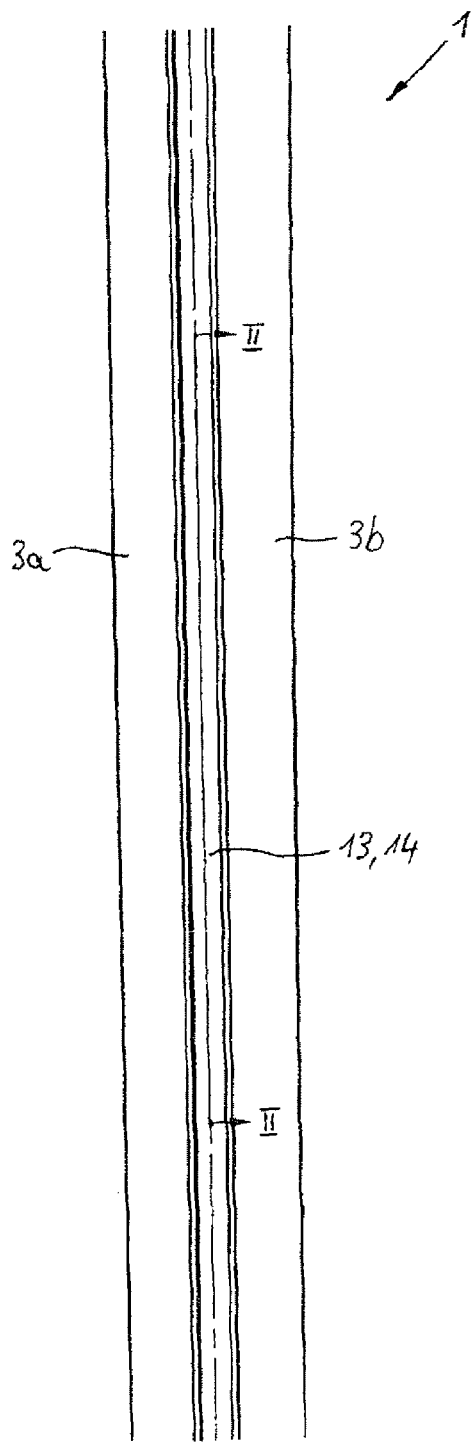
FIG. 1 is a plan view onto a partial portion of a guide path according to the invention.

FIGS. 1 to 6 show a guide path 1 having, as may be seen in particular from FIG. 4, a central part 2 and also side parts 3a, 3b arranged on both sides of the central part 2.

The central part 2 consists of a rod-shaped basic element which has a rectangular cross section and has on its upper side a central recess 3 extending in the longitudinal direction. The recess 4 forms a guide channel 13 in which electronic components 5, which are shown merely schematically in FIGS. 3 to 6, can slide along. The guide channel 13 is downwardly delimited (the term "downwardly" relates merely to the arrangement of the guide path 1 as illustrated in FIG. 4) by a base 6 and on both sides by lateral webs 7 of the central part 2.

Two parallel base-side guide rails 8, which are arranged laterally set apart alongside each other and the upper sides of which form the base-side guide surfaces 9, protrude above the base 6. The insides of the lateral webs 7 form lateral guide surfaces 10 laterally guiding the components 5.

In the exemplary embodiment shown, the base-side guide rails 8 are formed in one piece with the central part 2. It is however also readily possible to form said guide rails separately from the central part 2, for example by clamping corresponding flat profiles between a multiple-part central part in such a way that they protrude beyond the base 6 into the guide channel 13.

In order to prevent the components 5 from failing out of the guide channel 13 in the case of a perpendicular or oblique arrangement of the guide path 1, the side parts 3*a*, 3*b* have holding portions 11 which extend inward beyond the lateral webs 7 of the central part 2 and have at their free end guide rails 15 which partly overlap the components 5. The guide rails 15 thus have cover-side guide surfaces 12 which in the exemplary embodiment shown oppose the base-side guide surfaces 9 and are set apart therefrom by a distance which is somewhat greater than the height of the components 5, thus allowing the components 5 to slide freely within the guide channel 13.

The interval between the lateral guide surfaces 10, on the one hand, and the interval between the base-side guide surfaces 9 and the cover-side guide surfaces 12, on the other hand, thus determines a guide track 14 for the components 5.

Figure 2:
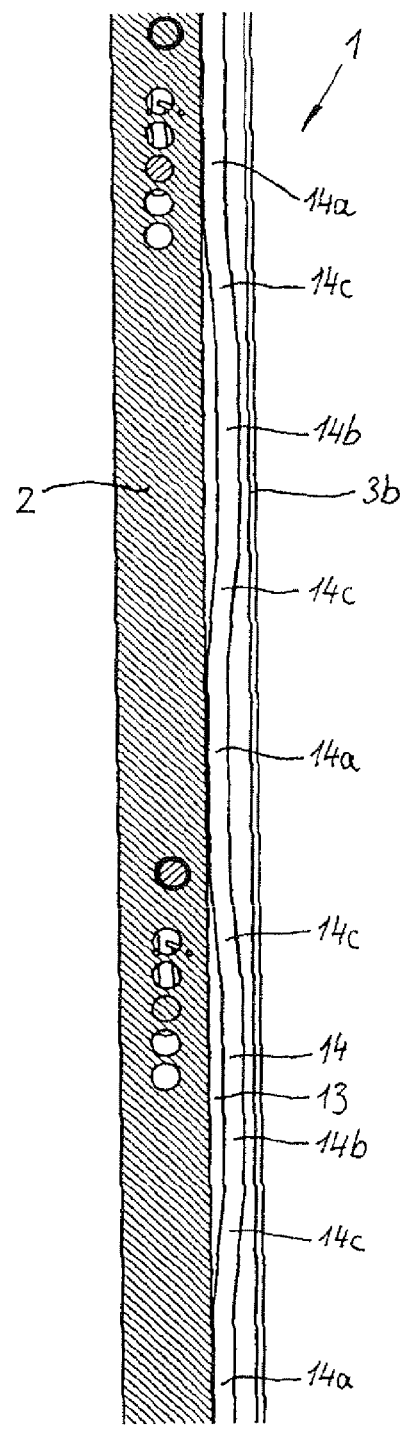
FIG. 2 is a longitudinal section along the line II-II from FIG. 1.

This guide track 14 undulates, as may be seen from FIGS. 2 and 3, at least over a portion of the length of the guide path 1. In the exemplary embodiment shown, the guide track 14 is deflected in a plane lying perpendicularly to the base-side guide surfaces 9 or cover-side guide surfaces 12. The undulating shape is in this case achieved as a result of the fact, that the degree by which the guide rails 8 protrude beyond the base 6 of the guide channel 13 varies along the guide channel 13. The course of the cover-side guide surface 12 is in this case adapted to that of the base-side guide surfaces 9, so the mutual distance remains at all times the same and the guide track 14 always has the same height.

As may be seen from. FIG. 2, in the exemplary embodiment shown, the undulating course of the guide track 14 is formed as a result of the fact that the guide track 14 has rectilinear track portions 14*a*, which are set apart from one another in the longitudinal direction and extend relatively close to the base 6 of the central part 2, and rectilinear track portions 14*b* which are arranged therebetween, are set somewhat further apart from the base of the central part 2 and extend parallel to the track portions 14*a*. The track portions 14*a*, 14*b* are joined together by means of oblique track portions 14*c*.

FIG. 2 shows that the guide channel 13 extends rectilinearly, although the guide track 14 moves back and forth within the guide channel 13.

Alternatively thereto, it is however also possible for the entire guide channel to undulate and the guide track to extend parallel to the guide channel or to be formed by the guide channel itself.

Furthermore, it is by implication also possible for the guide track to undulate in a plane lying parallel to the base-side or cover-side guide surfaces 9, 12, wherein in this case the position of the lateral guide surfaces 10 would vary toward the left and right in the view according to FIG. 4. Furthermore, it is also possible to combine the latter lateral wave course also with a wave course in the depth direction, as illustrated in FIGS. 2 and 3.

Figure 7:
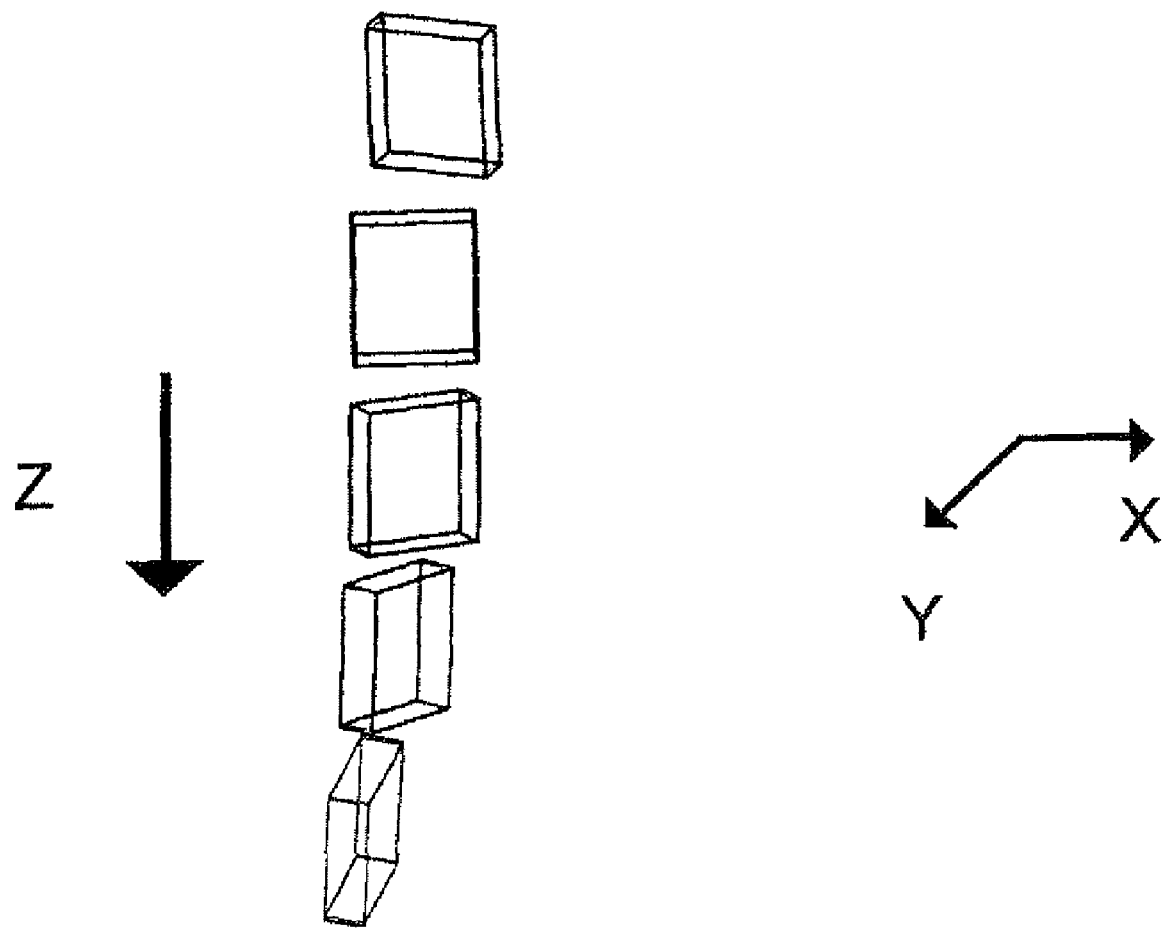
FIG. 7 shows an arrangement of the electronic components illustrating the nature of the guiding of the components in a curved and rotated guide path.

Additionally or alternatively to a guide track 14, which is deflected transversely to the fail direction, i.e. transversely to the 2 direction, it is also possible to reduce the fall speed of the modules 5 by rotating the guide track 14, in particular about, the longitudinal axis thereof. A guide track of this type (not shown) is illustrated by the arrangement of components 5 that is shown in FIG. 7. As may be seen, in this case the components 5 are deflected, when they slide downward, by a correspondingly shaped guide track not only in the X direction (and optionally also in the Y direction) but rather additionally also about the longitudinal direction of the guide track.

The invention claimed is:

1. A guide path for electronic components, in particular for use in handling robots for electronic components, with a guide channel which is arranged vertically or obliquely and is configured in such a way as to allow the components to slide along the guide channel owing to their gravitational force, the guide channel having at least one base-side guide surface, lateral guide surfaces and at least one cover-side guide surface, wherein the guide channel has an undulating guide track at least over a portion of its length, and wherein friction between the guide track and the component is increased and speed of the components is reduced so that damage to the components is reduced when the components strike stopping means.

2. The guide path as claimed in claim 1, wherein the guide track undulates in a plane lying perpendicularly to the base-side or cover-side guide surfaces.

3. The guide path as claimed in either claim 1, wherein the undulating course of the guide track is formed by base-side and cover-side guide rails on which the base-side and cover-side guide surfaces are provided, these guide surfaces being at varying distances from the base of the guide channel along the guide channel.

4. The guide path as claimed in claim 1, wherein the guide track undulates in a plane lying parallel to the base-side or cover-side guide surfaces.

5. The guide path as claimed in claim 1, wherein the undulating course of the guide track is formed by arched track portions.

6. The guide path as claimed in claim 1, wherein the undulating course of the guide track is formed by rectilinear, parallel track portions which are offset in the lateral and/or depth direction and are joined together by obliquely arranged track portions.

7. An electronic component guide path comprising:
   a guide channel comprising at least one base-side guide surface, lateral guide surfaces and at least one cover-side guide surface, the guide channel being configured to allow electronic components to slide along the guide surfaces under the force of gravity; and
   a stopping device disposed in communication with the guide channel, the stopping device being configured to stop the electronic components from further sliding upon striking the stopping device;
   the guide channel including an undulating guide track that applies friction to the sliding electronic components thereby reducing the speed of sliding components striking the stopping device to reduce the chance of damaging the electronic components when the electronic components strike the stopping device.

8. A method of guiding electronic components comprising:
sliding the electronic components under force of gravity along a guide channel comprising at least one base-side guide surface, lateral guide surface, and at least one cover-side guide surface;
sliding the electronic components through an undulating guide track disposed along at least a part of the length of the guide channel;
applying, with the undulating guide track, friction to the sliding electronic components while imposing a uniform delay on each said sliding component; and
after applying friction, directing the sliding components to strike a stopper while using said applied friction to reduce the speed of the sliding components striking the stopper thereby reducing the chance of damaging the electronic components when the electronic components strike the stopping device.

* * * * *